(12) United States Patent
Lim et al.

(10) Patent No.: US 6,673,695 B1
(45) Date of Patent: Jan. 6, 2004

(54) STI SCHEME TO PREVENT FOX RECESS DURING PRE-CMP HF DIP

(75) Inventors: Victor Seng-Keong Lim, Singapore (SG); Paul Proctor, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 217 days.

(21) Appl. No.: 10/062,657

(22) Filed: Feb. 1, 2002

(51) Int. Cl.[7] .............................................. H01L 21/76
(52) U.S. Cl. ....................................... 438/424; 438/433
(58) Field of Search ................................ 438/424, 427, 438/433, 437, 440

(56) References Cited

U.S. PATENT DOCUMENTS

| | | | | |
|---|---|---|---|---|
| 5,851,899 A | * | 12/1998 | Weigand | 438/427 |
| 5,943,590 A | * | 8/1999 | Wang et al. | 438/427 |
| 6,124,183 A | * | 9/2000 | Karlsson et al. | 438/427 |
| 6,169,012 B1 | | 1/2001 | Chen et al. | 438/427 |
| 6,194,285 B1 | | 2/2001 | Lin et al. | 438/424 |
| 6,207,533 B1 | * | 3/2001 | Gao | 438/424 |
| 6,242,322 B1 | | 6/2001 | Chen et al. | 438/424 |
| 6,258,676 B1 | | 7/2001 | Lee et al. | 438/296 |

* cited by examiner

*Primary Examiner*—Olik Chaudhuri
*Assistant Examiner*—David S Blum
(74) *Attorney, Agent, or Firm*—George O. Saile; Rosemary L. S. Pike

(57) ABSTRACT

A new method is provided for the creation of STI regions. STI trenches are created in the surface of a substrate following conventional processing. A layer of STI oxide is deposited and, using an exposure mask that is a reverse mask of the mask that is used to create the STI pattern, impurity implants are performed into the surface of the deposited layer of STI oxide. In view of these processing conditions, the layer of STI oxide overlying the patterned layer of etch stop material is exposed to the impurity implants. This exposure alters the etch characteristics of the deposited layer of STI oxide where this STI oxide overlies the patterned layer of etch stop material. The etch rate of the impurity exposed STI oxide is increased by the impurity implantation, resulting in an etch overlying the patterned etch stop layer that proceeds considerably faster than the etch of the STI oxide that is deposited overlying the created STI trenches. With the significantly faster etch of the STI oxide where this oxide has been exposed to impurity implantation, the STI oxide removal can be equalized between the STI oxide that overlies the patterned etch stop layer and the oxide that has been deposited over the STI trenches.

44 Claims, 5 Drawing Sheets

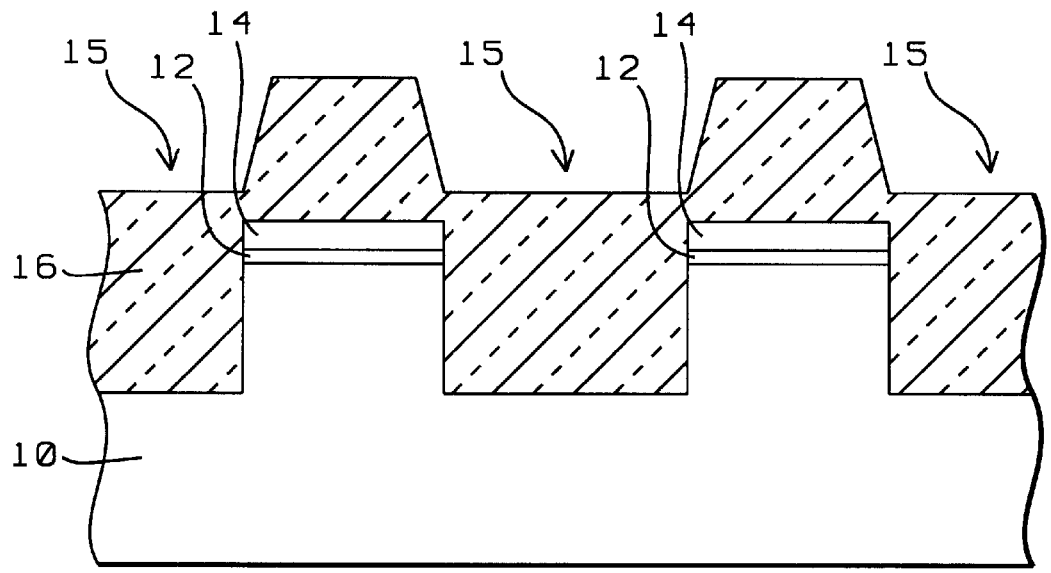
FIG. 1 — Prior Art
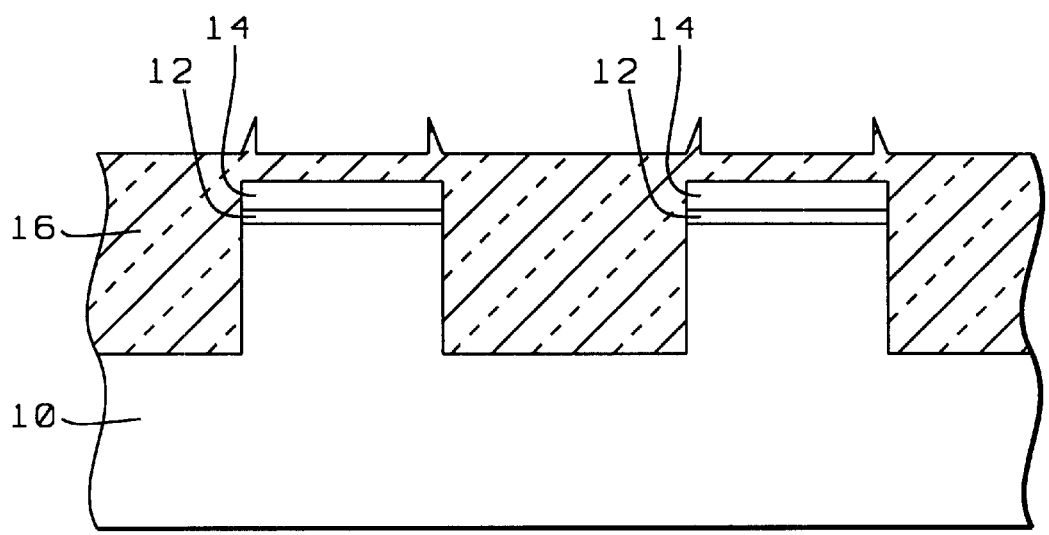
FIG. 2 — Prior Art

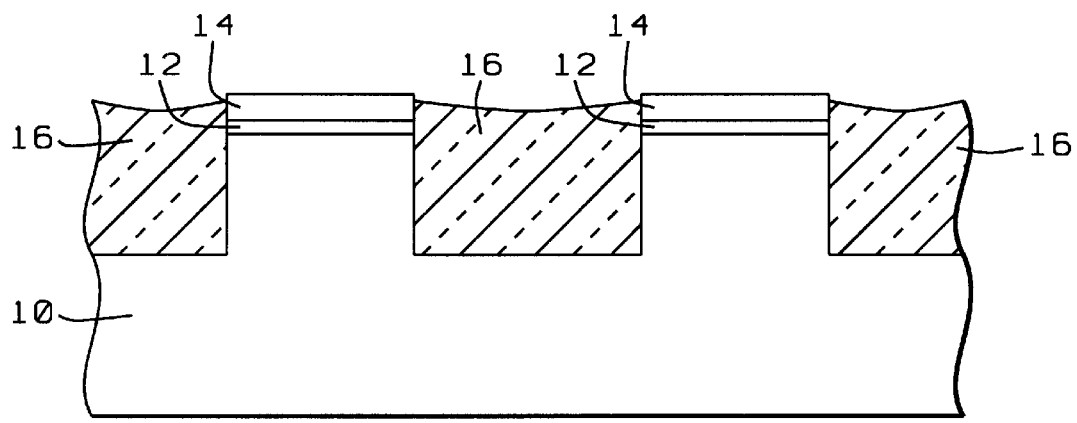
FIG. 3 - Prior Art
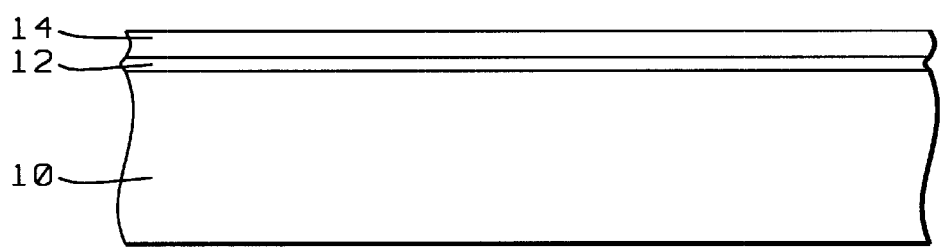
FIG. 4
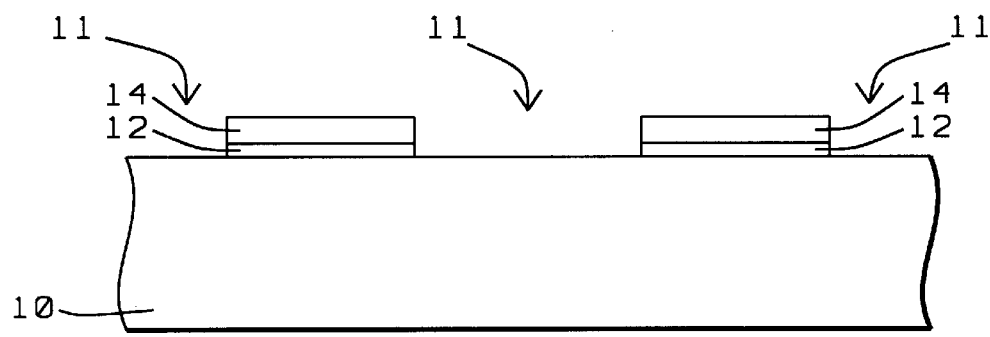
FIG. 5

STI SCHEME TO PREVENT FOX RECESS DURING PRE-CMP HF DIP

BACKGROUND OF THE INVENTION (1) Field of the Invention

The invention relates to the fabrication of integrated circuit devices, and more particularly, to a method for selective and controlled oxide removal as part of a process for the creation of Shallow Trench Isolation regions in the surface of a substrate.

(2) Description of the Prior Art

The art of creating semiconductor devices has over the years progressed in implementing improved device performance by reducing device feature dimensions and by creating semiconductor devices and packages of sharply increased densities. With these increased device densities, the challenge of providing adequate isolation of the created semiconductor devices takes on increased significance. Typically, the isolation of semiconductor devices is accomplished by creating shallow trenches in the surface of the substrate over which the devices are created and filling the created trenches with an isolation material such as silicon oxide and the like. The completed and filled trenches are commonly referred to as Shallow Trench Isolation (STI) regions in the surface of the substrate.

It is a requirement of creating STI regions in the surface of a substrate that the STI isolation material that is deposited in the created STI trenches is evenly distributed through the trenches in uniform density and has a surface of good planarity. This requirement must be maintained even for applications where the density of the created trenches varies over the surface of the substrate, resulting in significantly different absorption rates for densely spaced trenches when compared with widely spaced trenches. Inter-device isolation requirements may also vary, resulting in the creation of trenches of non-uniform width, which again places added burden on creating STI regions of good performance characteristics. A planar surface of STI regions after STI oxide fill is typically achieved by polishing the surface of the completed STI regions using methods of Chemical Mechanical Polishing (CMP) or methods of resist etch-back, reactive ion etching (RIE). The high degree of planarity of the surface of the STI region is required since the STI region is one of the first features that is created for a semiconductor device. Poor planarity of the surface of the STI regions therefore makes the maintenance of planarity throughout the steps of creating a complete device increasingly more difficult.

Conventional methods of creating STI regions in the surface of a substrate typically follow the sequence of first depositing a layer of pad oxide over the surface of a substrate after which a layer of etch stop material is deposited over the surface of the layer of pad oxide. The layers of pad oxide and etch stop material are patterned and etched, exposing the surface of the substrate where trenches for the STI regions are to be created. After the trenches for the STI regions have been etched in the exposed surface of the substrate, a layer of STI oxide is deposited over the surface of the etch stop layer, filling the created trenches. The etch stop layer is then removed, exposing the surface of the layer of pad oxide. The final step requires that the layer of STI oxide, which at this time protrudes above the surface of the substrate, is reduced in height, which is typically achieved by exposing the surface of the STI oxide, including the surface of the pad oxide, to a wet dip. During this latter step, care must be taken that the STI oxide is removed such that the surface planarity of the STI is maintained even to the point where the surface of the now reduced STI oxide is in the plane of the surface of the substrate. This latter objective is difficult to obtain due to differences in etch rates. It is therefore not uncommon to find that there is a need to provide special methods or materials such that the STI oxide, most notably in the perimeter of the surface of the STI oxide where this oxide interfaces with the surrounding substrate, maintains good planarity. The invention provides such a method by providing an impurity implantation into the deposited layer of STI oxide prior to the etch of this STI oxide.

U.S. Pat No. 6,258,676 B1 (Lee et al.) shows a STI planarization process using a reverse mask, etch back and CMP U.S. Pat. No. 6,242,322 B1 (Chen et al.) shows a STI planarization process using a reverse poly mask.

U.S. Pat. No. 6,194,285 B1 (Lin) shows a STI planarization process using a reverse mask.

U.S. Pat. No. 6,169,012 B1 (Chen et al.) shows a STI planarization process using a reverse mask and etch.

SUMMARY OF THE INVENTION

A principle objective of the invention is to prevent a recess or divot in the surface of a created fill of a Shallow Trench Isolation region.

In accordance with the objectives of the invention a new method is provided for the creation of STI regions. STI trenches are created in the surface of a substrate following conventional processing. A layer of STI oxide is deposited and, using an exposure mask that is a reverse mask of the mask that is used to create the STI pattern, impurity implants are performed into the surface of the deposited layer of STI oxide. In view of these processing conditions, the layer of STI oxide overlying the patterned layer of etch stop material is exposed to the impurity implants. This exposure alters the etch characteristics of the deposited layer of STI oxide where this STI oxide overlies the patterned layer of etch stop material. The etch rate of the impurity exposed STI oxide is increased by the impurity implantation, resulting in an etch overlying the patterned etch stop layer that proceeds considerably faster than the etch of the STI oxide that is deposited overlying the created STI trenches. Since, without an impurity implant, the deposited layer of STI oxide etches at a uniform rate, the etch will remove the SIT oxide from the STI trench, thus causing a recess in the surface of the STI oxide inside the STI trenches. With the significantly faster etch of the STI oxide where this oxide has been exposed to impurity implantation, the STI oxide removal can be equalized between the STI oxide that overlies the patterned etch stop layer and the oxide that has been deposited over the STI trenches.

BRIEF DESCRIPTION OF THE DRAWINGS

FIGS. 1 through 3 show conventional processing steps, as follow:

FIG. 1 shows a cross section of a substrate, patterned layers of pad oxide and etch stop material have been created over the surface of the substrate, trenches have been etched into the surface of the substrate in accordance with the pattern of etch stop material, a layer of HDP oxide has been deposited into the trenches and overlying the patterned etch stop material.

FIG. 2 shows a cross section after etch back of the deposited layer of HDP oxide using a mask that is a reverse mask of the mask that is used to pattern the etch stop layer and the layer of pad oxide.

FIG. 3 shows a cross section after an HF dip has been applied to the exposed surface.

The invention is explained using FIGS. 4 through 11, as follows:

FIG. 4 shows a cross section of a silicon substrate over the surface of which a layer of pad oxide and a layer of etch stop material have been deposited.

FIG. 5 shows a cross section after the layers of pad oxide and of etch stop material have been patterned and etched.

Figure 6:
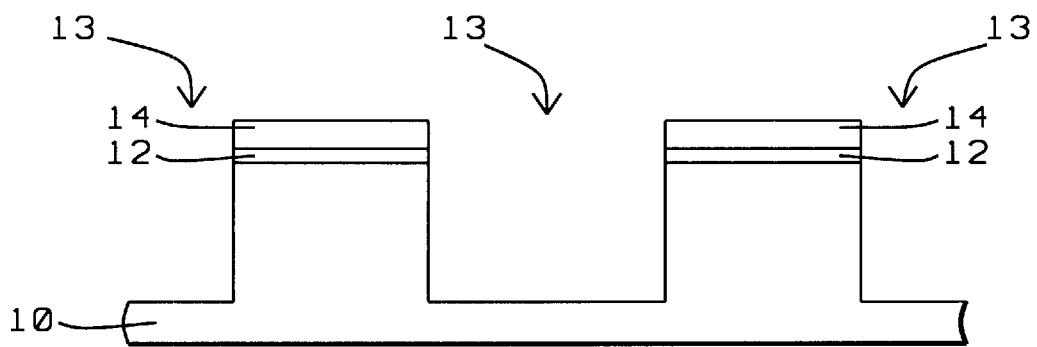

FIG. 6 shows a cross section after trenches have been etched into the surface of the substrate in accordance with the pattern of the etch stop layer.

Figure 7:
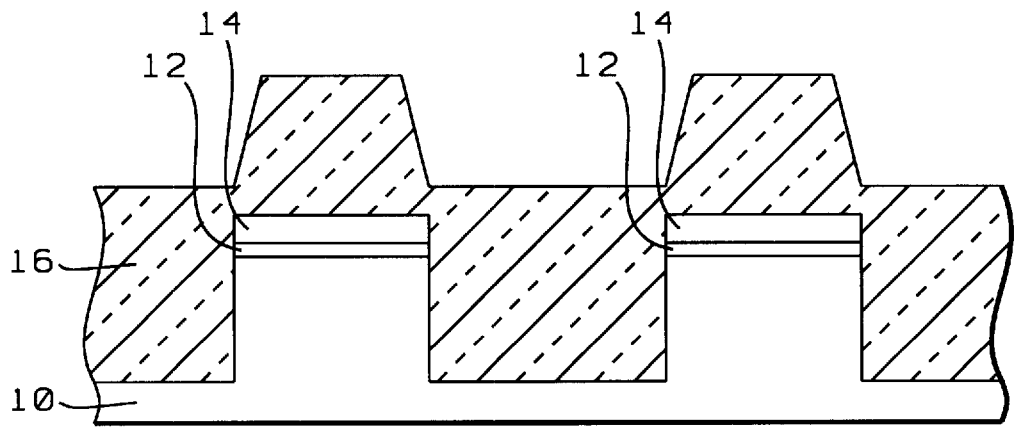

FIG. 7 shows a cross section after a layer of STI oxide has been blanket deposited.

Figure 8:
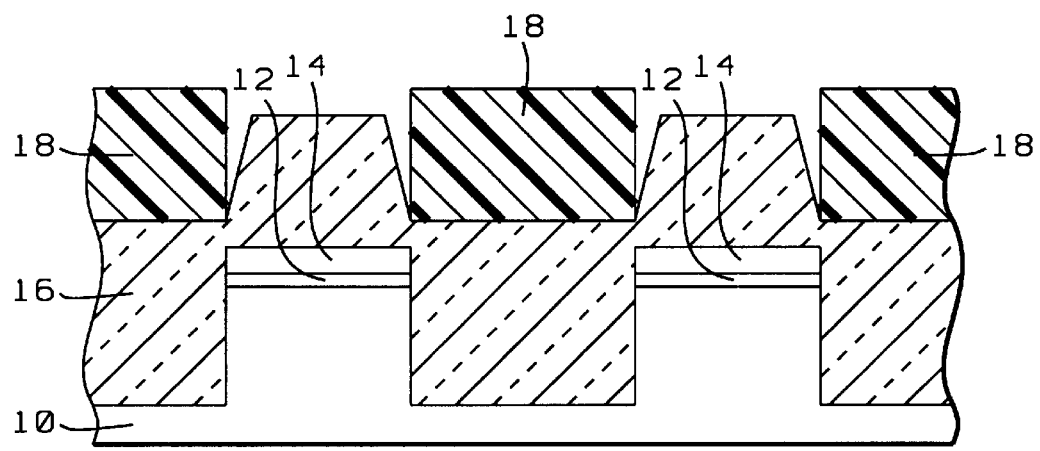

FIG. 8 shows a cross section after a mask of photoresist has been created over the surface of the deposited layer of STI oxide.

Figure 9:
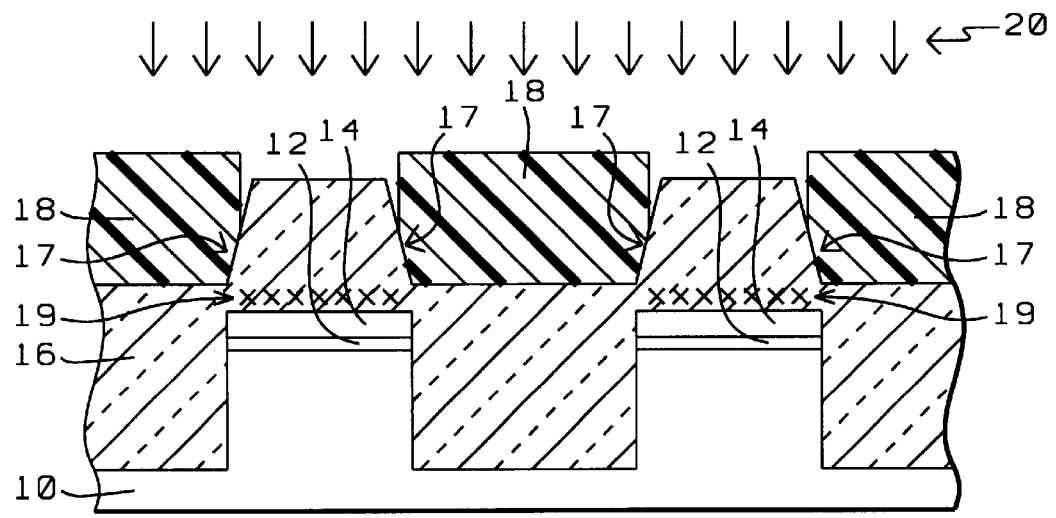

FIG. 9 shows a cross section during impurity implantation into the surface of the created structure.

Figure 10:
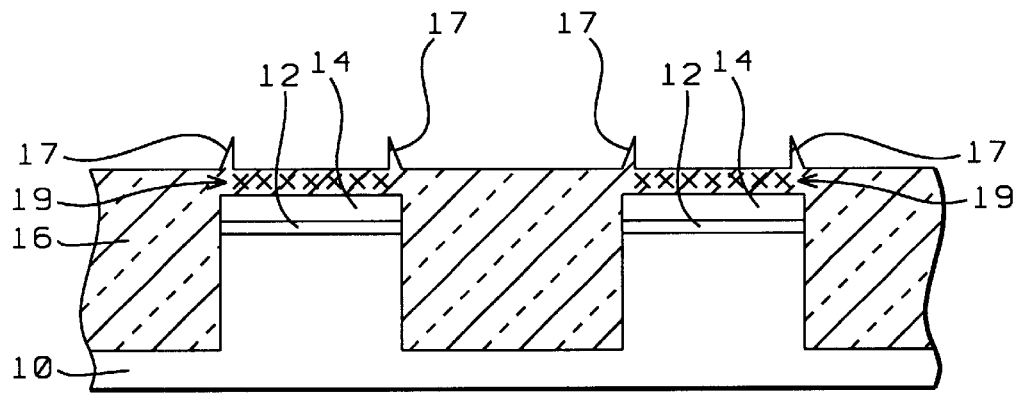

FIG. 10 shows a cross section after the photoresist mask has been removed from the surface and an STI oxide etch back has been performed.

Figure 11:
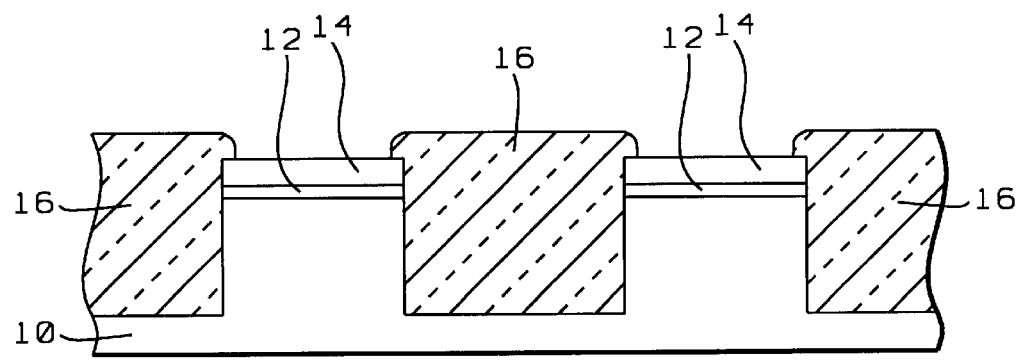

FIG. 11 shows a cross section after a HF dip has been completed to remove excess STI oxide from the surface of the patterned etch stop layer.

DESCRIPTION OF THE PREFERRED EMBODIMENTS

For comparative purposes, the conventional method of creating an oxide fill in STI trenches is first briefly reviewed using FIGS. 1 through 3.

FIG. 1 shows:

10, a cross section of a substrate 12, a patterned layer of pad oxide created over the surface of the substrate 10

14, a patterned layer of etch stop material created over the surface of the substrate 15, trenches etched into the surface of the substrate 10 in accordance with the pattern of etch stop material 14

16, a layer of HDP oxide deposited into the trenches 15 and overlying the pattern of etch stop material 14.

FIG. 2 shows a cross section after (a dry) etch back of the deposited layer 16 of HDP oxide using a mask (not shown) that is a reverse mask of the mask that is used to pattern the etch stop layer 14 and the layer of pad oxide 12. This reverse mask etch removes most of the HDP oxide from above the pattern of etch stop material 14, the layers of HDP oxide that remain in place after the HDP oxide etch back are further removed from the surface of the patterned layer 14 of etch stop material by applying a HF dip to the surface of layer 16 of HDP oxide. The results of this dip are shown in the cross section of FIG. 3.

FIG. 3 shows a cross section after an HF dip has been applied to the exposed surface of the layer 16 of HDP oxide that has been shown in cross section in FIG. 2. All of the HDP oxide is removed from the surface of the patterned layer 14 of etch stop material. However, due to the isotropic nature of the wet etch process, the oxide will also be removed from the surface of the layer of HDP oxide that has been deposited inside trenches 15, resulting in a recess of the surface of the HDP oxide inside trenches 15. This recess is present even before final planarization is achieved by polishing the surface of the structure that is shown in cross section in FIG. 3, using methods of Chemical Mechanical Polishing (CMP). The applied CMP will further accentuate the recess of the surface of the layer 16, FIG. 3, inside the STI trenches.

The invention deviates from the above highlighted processing sequence by additionally applying a step of impurity ion implantation before the above highlighted step (FIG. 2) of etching the deposited layer of HDP oxide with a dry etch. This will be explained in detail using FIGS. 4 through 11.

FIG. 4 shows a cross section of a semiconductor substrate 10 in the surface of which have been created a layer 12 of pad oxide over which a layer 14 of silicon nitride has been deposited.

For the deposition of the thin layer 12 of pad oxide uses conventional methods such as Low Pressure CVD deposition technology. The LPCVD technology provides high deposition rates and excellent film thickness uniformity. The thin layer 12 of oxide is typically created to a thickness of between 20 and 500 Angstrom. Layer 12 serves as a stress release between the silicon substrate 10 and layer 14 of silicon nitride.

As an example for the growing of layer 12 of pad oxide the following processing conditions can be cited: source: wet $O_2$ provided at a flow rate for the $O_2$ of about 0 to 10 sccm and a flow rate for the $H_2$ of about 15 slpm, temperature of about 875 degrees C., under atmospheric pressure, time of about 30 minutes. For this creation of layer 12 of pad oxide a furnace is used, due to the thermal oxide.

Layer 14 is an etch stop layer, commonly containing silicon nitride ($Si_3N_4$) and is typically deposited using LPCVD or PECVD procedures, at a temperature between about 200 and 800 degrees C., to a thickness between about 200 and 5,000 Angstrom employing $Si_3N_4$ or $SiO_xN_y$ as a silicon source material and ammonia as a nitrogen source material. As one example, the layer 14 of silicon nitride can be created using a one step PECVD or LPCVD procedure such as simultaneously employing gasses containing silicon and nitrogen, such as using $SiH_4$ of $SiCl_2H_2$ and $N_2$ or $NH_3$.

FIG. 5 shows a cross section of substrate 10 after the layer 12 of pad oxide and the layer 14 of nitride have been patterned and etched. The openings 11 that have been etched through layers 12 and 14 align with the surface of the substrate where trenches for STI regions will be etched.

The layer 14 of silicon nitride can be anisotropically etched with a plasma gas containing carbon tetrafloride ($CF_4$) containing fluorine ions, in a commercial etcher such as a parallel plate RIE apparatus or an electron cyclotron resonance (ECR) plasma reactor. Layer 14 of silicon nitride can also be etched using $He/NF_3$ as an etchant at a temperature of between about 80 and 100 degrees C. and a pressure of about 1.20 and 1.30 Torr for a time of between about 20 and 30 seconds using a dry etch process.

Typically, oxides such as layer 12 of pad oxide can be etched using $Ar/CF_4$ as an etchant at a temperature of between about 120 and 160 degrees C. and a pressure of between about 0.30 and 0.40 Torr for a time of between about 33 and 39 seconds using a dry etch process. The preferred processing conditions for the etching of layer 12 of pad oxide are as follows: wet dip or HF pure vapor are preferred, time for the wet dip is about 30 seconds, the HF vapor uses pure HF with a ratio of $H_2O:HF=2:1$ applied for a time between about 1 and 2 seconds.

FIGS. 6 shows a cross section of the substrate after trenches 13 have been etched into the surface of substrate 10. The process of creating the STI openings 13 is performed mainly by plasma etching. The etching of the STI trenches 13 can be performed using a wet etchant. One suitable wet etchant for a wafer that is formed of monocrystalline silicon is a solution containing a mixture of KOH (potassium hydroxide) and $H_2O$. This solution anisotropically etches the silicon substrate, forming grooves in the substrate having sidewalls that are sloped at an angle of about 54 degrees C. with the horizontal. The slope of the sidewalls is a function of the different etch rates of monocrystalline silicon along the different crystalline orientations. The surface of the substrate represents <100> planes of the silicon, which etches faster than the sloped sidewalls that represent the <111> plane.

Grooves 13 can also be created applying plasma etching. By appropriate choice of the gasses of the gaseous medium and the parameters of the discharge established in the plasma etch chamber, selective and anisotropic etching is achieved. In most modern processes, a dry etch is performed wherein the wafer is exposed to a plasma, formed in the flow of one or more gasses. Typically, one or more halogenated compounds are used as an etchant gas. For example, $CF_4$, $CHF_3$ (Freon 23) $SF_6$ or $NF_3$ can be used. Added can be gases such as $O_2$, Ar and $N_2$.

The invention continues, FIG. 7, with the deposition of a layer 16 of STI oxide, preferably comprising High Density Plasma (HDP) oxide. The layer 16 of HDP-oxide can be deposited using LPCVD technology, preferably deposited to a thickness such that trenches 13, FIG. 6, are filled with the HDP oxide. A layer of HDP oxide will also be deposited overlying the patterned layer 14 of etch stop material.

The invention at this time in the processing cycle provides for, in significant variance with conventional methods of creating STI regions in the surface of a substrate selectively modifying the etch rate of the deposited layer 16 of HDP oxide. This selective modification of the etch rate of the deposited layer 16 of HDP oxide results in a faster etch rate of the HDP oxide overlying the patterned layer 14 of etch stop material when compared with the etch rate of the HDP oxide that fills the STI trenches 13 (FIG. 6).

To achieve the selectivity of the modification of the etch rate of the deposited layer 16 of HDP oxide, a mask 18, FIG. 8, of photoresist is created over the deposited layer 16 of HDP oxide. This mask 18 of photoresist has a pattern that is the reverse pattern of the patterned layer 14 of etch stop material. The mask that is used for the creation of patterned layer 18 of photoresist is therefore the reverse mask of the mask that is used for the creation of the patterned layer 14 of etch stop material. By using a reverse mask for the creation of the patterned layer 18 of photoresist, the layer 16 of HDP oxide is exposed where this layer overlies the patterned layer 14 of etch stop material. It is from these exposed surface regions of the layer 16 of HDP oxide that the HDP oxide must be most aggressively removed and must be removed at a rate that is selected such that, after the etching of the layer 16 of HDP is complete, results in a surface of good planarity of the surface of layer 16 of HDP oxide.

By performing a blanket impurity implantation 20, FIG. 9, into the exposed surfaces of layers 16 and 18, the etch rate of the exposed layer 16 of HDP oxide is increased by a factor of about 2 when compared with the non-exposed layer of HDP oxide. Since the layer 16 of HDP oxide is exposed where this layer 16 overlies the patterned layer 14 of etch stop material (due to the selective blocking of the exposure 18 by photoresist mask 18), the layer 16 of HDP oxide overlying the patterned layer 14 of etch stop material will be etched at about twice the rate as the HDP oxide that overlies the STI trenches.

The optimum conditions for the implant 20 must be experimentally determined and depend on specific conditions of semiconductor device creation such as the density of the STI trenches, the parameters of cross section of the STI trenches, the thickness of the deposited layer 16 of STI oxide and the like. A number of examples will be cited, which represent a lightly doped implantation, a medium doped implantation and a highly doped implantation, as follows:

a lightly doped implantation, wherein a first conductivity imparting dopant is phosphorous, ion implanted at an energy between about 5 to 100 KeV, at a dose between about 1E11 to 1E14 atoms/cm$^2$ a medium doped implantation, wherein a second conductivity imparting dopant is arsenic or phosphorous, ion implanted at an energy between about 5 to 50 KeV, at a dose between about 1E12 to 5E14 atoms/cm$^2$, and a heavily doped implantation, wherein a third conductivity imparting dopant is arsetic, ion implanted at an energy between about 5 to 150 KeV, at a dose between about 1E15 to 1E16 atoms/cm$^2$.

It is clear the impurity implantation 20 is not limited to either an n-type impurity implantation such as using arsenic or phosphorous impurity ions or an p-type implantation such as using indium or boron impurity ions. Nor is impurity implantation limited to either a high density, high concentration implantation of a medium density, medium concentration implantation of a low density, low concentration implantation or any combination thereof. Experimental results are required to determine optimum conditions and type for impurity implantation 20.

It must thereby be noted that an implantation angle of 90 degrees with the surface of the implanted layers is preferred. This to assure that the periphery or edge of the surface area of the patterned layers 14 of etch stop material do not receive any implantation species and therefore remain unmodified in their etch characteristics.

It will be noted in the cross section that is shown in FIG. 9 that in the regions that are highlighted as regions 17, the photoresist mask 18 overlies the layer 16 of HDP oxide. Therefore, if the implantation 20 has a zero tilt angle, no impurity ions will penetrate regions 17 (see also FIG. 10), therefore leaving these regions essentially in place during a subsequent etch of layer 16 since these regions maintain their relatively slow etch rate.

Specifically highlighted in the cross section of FIG. 9 are regions 19 since the modified etch rate of these regions plays a unique role in creating a desired surface profile after the conventional etchback of layer 16. This will become more clear in going from the cross section of FIG. 10 to the cross section of FIG. 11.

After impurity implantation 20 has been completed, the photoresist mask 18 is removed from the surface using conventional methods of for instance oxygen ashing and clean.

As an alternate method the following sequence can be applied: instead of performing an implantation step before the oxide etchback (of layer 17), the implantation step can also be performed after the oxide etchback step has been completed and at the time that the photoresist mask 18 has not yet been removed. The advantage of this alternate sequence is that if the oxide 17 is too thick, the photoresist mask 18 may not be effective in blocking all the implantation species.

The invention now proceeds with conventionally etching layer 16 of HDP oxide, applying an oxide etchback, resulting in the cross section that is shown in FIG. 10. The etching of layer 16 of HDP oxide can be performed in a HDP oxide etcher with a recipe comprising Ar, $CHF_3$, $C_4F_8$ at flow rates of 50–150, 10–150 and 0–20 sccm respectively. The etching of layer 16 of HDP oxide can also be performed by applying isotropic plasma etching in an etchant comprising $SF_6$, performed in a parallel HDP reactor in-situ, in a plasma containing $CF_4$ at a flow rate of between about 30 and 60 sccm, in a carrier gas at a flow rate sufficient to maintain a pressure between about 5 and 15 mTorr in the HDP reactor and at an rf power of between about 400 and 1,200 Watts TCP with between about 1,000 and 1,500 Watts bias.

As a final step of creating oxide filled STI regions in the surface of a substrate, the invention applies a HF dip to the surface of the structure that is shown in cross section in FIG. 10, resulting in a structure that has a cross section as shown in FIG. 11. A wet etching with a HF (Hydro-Fluoric acid) containing solution like a BOE solution can be used for this purpose. The HF wet dip removes the HDP oxide 16 from the surface of the patterned layer 14 of silicon nitride. The doped HDP oxide in region 19 has, due to the impurity implantation 20, a higher etch rate and will therefore be removed from the surface of the patterned layers 14 at a higher rate when compared with the non-doped HDP oxide, which is the oxide overlying the STI trenches. The profile that is shown in cross section in FIG. 11 is therefore obtained.

Also, the time during which the HF dip is applied can be reduced because the HDP oxide overlying the patterned layer of silicon nitride is removed at a higher rate. This further accomplishes the objective of the invention of preventing a recess in the oxide that has been deposited in the STI trenches 13. As a final point must it be observed that the topology of the surface that is shown in cross section in FIG. 11 is more suited to a subsequent step of CMP, which is applied to further enhance surface planarity.

The invention, of creating regions of Shallow Trench Isolation (STI) in the surface of a substrates can be summarized as follows:

the invention starts with a substrate, the substrate is provided with an objective of creating semiconductor devices over the surface thereof a layer of pad oxide is created over the surface of the substrate a layer of etch stop material is deposited over the surface of the layer of pad oxide the layer of etch stop material and the layer of pad oxide are patterned and etched, using a first exposure mask, creating at least one opening through the layers of etch stop material and the layer of pad oxide, the at least one opening being aligned with at least one surface area over the surface of the substrate where at least one region of Shallow Trench Isolation is to be created at least one STI trench is created in the surface of the substrate in accordance with the at least one opening created through the layers of etch stop material and the layer of pad oxide a layer of STI dielectric is blanket deposited over the surface of the patterned and etched layer of etch stop material, filling the at least one opening created through the layers of etch stop material and the layer of pad oxide, further filling the at least one STI trench created in the surface of the substrate an impurity ion implantation blocking mask is created over the surface of the layer of STI dielectric using a second exposure mask, the second exposure mask being a reverse mask of the first exposure mask, blocking the surface of the layer of STI dielectric where the layer of STI dielectric overlies the at least one STI trench created in the surface of the substrate an impurity ion implantation is performed into the exposed surface of the layer of STI dielectric in accordance with the ion implantation blocking mask, creating at least two first layers of doped STI dielectric overlying the patterned and etched layer of etch stop material, the at least two first layers of doped STI dielectric surrounding at least one second layer of undoped STI dielectric overlying the at least one STI trench created in the surface of the substrate, increasing an etch rate of the at least two first layers of doped STI dielectric by a measurable amount the impurity ion implantation blocking mask is removed from the surface of the layer of STI dielectric the at least two first doped and the at least one second undoped layers of STI dielectric are etched to where the layer of STI dielectric overlies the surface of the patterned and etched layer of etch stop material to a measurable height, and the layer of STI dielectric is removed from the surface of the patterned and etched layer of etch stop material.

The alternate method of the invention, of creating regions of Shallow Trench Isolation (STI) in the surface of a substrate, can be summarized as follows:

the alternate method starts with a substrate, the substrate is provided with an objective of creating semiconductor devices over the surface thereof a layer of pad oxide is created over the surface of the substrate a layer of etch stop material is deposited over the surface of the layer of pad oxide the layer of etch stop material and the layer of pad oxide are patterned and etched using a first exposure mask, creating at least one opening through the layers of etch stop material and the layer of pad oxide, the at least one opening being aligned with at least one surface area over the surface of the substrate where at least one region of Shallow Trench Isolation is to be created at least one STI trench is created in the surface of the substrate in accordance with the at least one opening created through the layers of etch stop material and the layer of pad oxide a layer of STI dielectric is blanket deposited over the surface of the patterned and etched layer of etch stop material, filling the at least one opening created through the layers of etch stop material and the layer of pad oxide, further filling the at least one STI trench created in the surface of the substrate an impurity ion implantation blocking mask is created over the surface of the layer of STI dielectric using a second exposure mask, the second exposure mask being a reverse mask of the first exposure mask, blocking the surface of the layer of STI dielectric where the layer of STI dielectric overlies the at least one STI trench created in the surface of the substrate the layer of STI dielectric is etched to where the layer of STI dielectric overlies the surface of the patterned and etched layer of etch stop material to a measurable height an impurity ion implantation is performed into the exposed surface of the layer of STI dielectric in accordance with the ion implantation blocking mask the impurity ion implantation blocking mask is removed from the surface of the layer of STI dielectric, and the layer of STI dielectric is removed from the surface of the patterned and etched layer of etch stop material.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating regions of Shallow Trench Isolation (STI) in the surface of a substrate, comprising the steps of:

providing a substrate, the substrate is provided with an objective of creating semiconductor devices over the surface thereof;

creating a layer of pad oxide over the surface of said substrate;

depositing a layer of etch stop material over the surface of said layer of pad oxide;

patterning and etching said layer of etch stop material and said layer of pad oxide using a first exposure mask, creating at least one opening through said layers of etch stop material and said layer of pad oxide, said at least one opening being aligned with at least one surface area over the surface of said substrate where at least one region of Shallow Trench Isolation is to be created;

creating at least one STI trench in the surface of said substrate in accordance with said at least one opening created through said layers of etch stop material and said layer of pad oxide;

blanket depositing a layer of STI dielectric over the surface of said patterned and etched layer of etch stop material, filling said at least one opening created through said layers of etch stop material and said layer of pad oxide, further filling said at least one STI trench created in the surface of said substrate;

creating an impurity ion implantation blocking mask over the surface of said layer of STI dielectric using a second exposure mask, said second exposure mask being a reverse mask of said first exposure mask, blocking the surface of said layer of STI dielectric where said layer of STI dielectric overlies said at least one STI trench created in the surface of said substrate;

performing an impurity ion implantation into the exposed surface of said layer of STI dielectric in accordance with said ion implantation blocking mask, creating at least two first layers of doped STI dielectric overlying said patterned and etched layer of etch stop material, said at least two first layers of doped STI dielectric surrounding at least one second layer of undoped STI dielectric overlying said at least one STI trench created in the surface of said substrate, increasing an etch rate of said at least two first layers of doped STI dielectric by a measurable amount;

removing said impurity ion implantation blocking mask from the surface of said layer of STI dielectric;

etching said at least two first doped and said at least one second undoped layers of STI dielectric to where said layer of STI dielectric overlies the surface of said patterned and etched layer of etch stop material to a measurable height; and removing said layer of STI dielectric from the surface of said patterned and etched layer of etch stop material.

2. The method of claim 1, said pad oxide having a thickness of between about 20 and 500 Angstrom.

3. The method of claim 1, said layer of etch stop material comprising silicon nitride deposited to a thickness between about 200 and 5,000 Angstrom.

4. The method of claim 1, said STI dielectric comprising HDP oxide.

5. The method of claim 1, said increasing an etch rate of said at least two first layers of doped STI dielectric by a measurable amount comprising increasing said etch rate of said at least two first layers of doped STI dielectric by a factor of about 2.

6. The method of claim 1, said impurity ion implantation blocking mask comprising photoresist.

7. The method of claim 1, said creating an impurity ion implantation blocking mask over the surface of said layer of STI dielectric using a second exposure mask comprising methods of photolithographic exposure and development of an exposed semiconductor material.

8. The method of claim 7, said semiconductor material comprising photoresist.

9. The method of claim 1, said impurity ion implantation into the exposed surface of said layer of STI dielectric being provided under an angle of about ninety degrees with the surface of said deposited layer of STI dielectric.

10. The method of claim 1, said etching said at least two first doped and said at least one second undoped layers of STI dielectric comprising an oxide etchback.

11. The method of claim 1, removing said layer of STI dielectric from the surface of said patterned and etched layer of etch stop material comprising a HF dip.

12. The method of claim 11, further applying a reduction in the timing of the HF dip.

13. The method of claim 1, with an additional step of planarization applied to the surface of said patterned and etched layer of etch stop material and the surface of said layer of STI dielectric.

14. The method of claim 13, said step of planarization comprising methods of Chemical Mechanical Polishing (CMP).

15. A method of creating regions of Shallow Trench Isolation (STI) in the surface of a substrate, comprising the steps of:

providing a substrate, the substrate is provided with an objective of creating semiconductor devices over the surface thereof;

creating at least one STI trench in the surface of said substrate using a first exposure mask;

depositing a layer of STI dielectric over the surface of said substrate, filling said at least one STI trench created in the surface of said substrate;

selectively modifying an etch rate of at least two first cross sections of said deposited layer of STI dielectric, said at least two first cross sections being adjacent to said at least one STI trench created in the surface of said substrate; and removing said layer of STI dielectric from above the surface of said substrate, leaving said STI dielectric deposited inside said at least one trench created in the surface of said substrate.

16. The method of claim 15, said creating at least one STI trench in the surface of said substrate comprising the steps of:

creating a layer of pad oxide over the surface of said substrate;

depositing a layer of etch stop material over the surface of said layer of pad oxide;

patterning and etching said layer of etch stop material and said layer of pad oxide using a first exposure mask, creating at least one opening through said layers of etch stop material and said layer of pad oxide, said at least one opening being aligned with at least one surface area over the surface of said substrate where at least one region of Shallow Trench Isolation is to be created; and etching the surface of said substrate in accordance with said at least one opening created through said layers of etch stop material and said layer of pad oxide, creating at least one STI trench in the surface of said substrate in accordance with said at least one opening created through said layers of etch stop material and said layer of pad oxide.

17. The method of claim 15, said selectively modifying an etch rate of said at least two first cross sections of said deposited layer of STI dielectric comprising the steps of:

creating an impurity ion implantation blocking mask over the surface of said layer of STI dielectric using a second exposure mask, said second exposure mask being a reverse mask of said first exposure mask, exposing the surface of at least two first cross sections of said layer of STI dielectric where said layer of STI dielectric is adjacent to said at least one STI trench created in the surface of said substrate;

performing an impurity ion implantation into the exposed surface of said layer of STI dielectric in accordance with said ion implantation blocking mask, creating at least two first cross sections of layers of doped STI dielectric adjacent to said at least one STI trench created in the surface of said substrate, said at least two first cross sections of layers of doped STI dielectric being adjacent to at least one second cross section of a layer of undoped STI dielectric, said at least one second cross section of a layer of undoped STI dielectric being aligned with said at least one STI trench created in the surface of said substrate, increasing an etch rate of said at least two first cross sections of doped STI dielectric by a measurable amount; and removing said impurity ion implantation blocking mask from the surface of said layer of STI dielectric.

18. The method of claim 15, said removing said selectively modified layer of STI dielectric from above the surface of said substrate comprising the steps of:

etching said at least two first cross sections of doped STI dielectric and said at least one second cross section of undoped STI dielectric to where said layer of STI dielectric overlies the surface of said substrate to a measurable height; and removing said layer of STI dielectric from surfaces adjacent to said at least on STI trench created in the surface of said substrate.

19. The method of claim 16, said pad oxide having a thickness of between about 20 and 500 Angstrom.

20. The method of claim 16, said layer of etch stop material comprising silicon nitride deposited to a thickness between about 200 and 5,000 Angstrom.

21. The method of claim 15, said STI dielectric comprising HDP oxide.

22. The method of claim 15, said selectively modifying an etch rate of at least two first cross sections of said deposited layer of STI dielectric comprising increasing said etch of said at least two first cross sections of said deposited layer of STI dielectric rate by a factor of about 2.

23. The method of claim 17, said impurity ion implantation blocking mask comprising photoresist.

24. The method of claim 17, said creating an impurity ion implantation blocking mask over the surface of said layer of STI dielectric using a second exposure mask comprising methods of photolithographic exposure and development of an exposed semiconductor material.

25. The method of claim 24, said semiconductor material comprising photoresist.

26. The method of claim 17, said impurity ion implantation into the exposed surface of said layer of STI dielectric being provided under an angle of about ninety degrees with the surface of said deposited layer of STI dielectric.

27. The method of claim 18, said etching said at least two first cross sections of doped STI dielectric and said at least one second cross section of undoped STI dielectric to where said layer of STI dielectric overlies the surface of said substrate to a measurable height comprising an oxide etchback.

28. The method of claim 18, said removing said layer of STI dielectric from surfaces adjacent to said at least on STI trench created in the surface of said substrate comprising a HF dip.

29. The method of claim 28, further applying a reduction in the timing of the HF dip.

30. The method of claim 15, with an additional step of planarization applied to the surface of said patterned and etched layer of etch stop material and the surface of said layer of STI dielectric.

31. The method of claim 30, said step of planarization comprising methods of Chemical Mechanical Polishing (CMP).

32. A method of creating regions of Shallow Trench Isolation (STI) in the surface of a substrate, comprising the steps of:

providing a substrate, the substrate is provided with an objective of creating semiconductor devices over the surface thereof;

creating a layer of pad oxide over the surface of said substrate;

depositing a layer of etch stop material over the surface of said layer of pad oxide;

patterning and etching said layer of etch stop material and said layer of pad oxide using a first exposure mask, creating at least one opening through said layers of etch stop material and said layer of pad oxide, said at least one opening being aligned with at least one surface area over the surface of said substrate where at least one region of Shallow Trench Isolation is to be created;

creating at least one STI trench in the surface of said substrate in accordance with said at least one opening created through said layers of etch stop material and said layer of pad oxide;

blanket depositing a layer of STI dielectric over the surface of said patterned and etched layer of etch stop material, filling said at least one opening created through said layers of etch stop material and said layer of pad oxide, further filling said at least one STI trench created in the surface of said substrate;

creating an impurity ion implantation blocking mask over the surface of said layer of STI dielectric using a second exposure mask, said second exposure mask being a reverse mask of said first exposure mask, blocking the surface of said layer of STI dielectric where said layer of STI dielectric overlies said at least one STI trench created in the surface of said substrate;

etching said layer of STI dielectric to where said layer of STI dielectric overlies the surface of said patterned and etched layer of etch stop material to a measurable height;

performing an impurity ion implantation into the exposed surface of said layer of STI dielectric in accordance with said ion implantation blocking mask;

removing said impurity ion implantation blocking mask from the surface of said layer of STI dielectric; and removing said layer of STI dielectric from the surface of said patterned and etched layer of etch stop material.

33. The method of claim 32, said pad oxide having a thickness of between about 20 and 500 Angstrom.

34. The method of claim 32, said layer of etch stop material comprising silicon nitride deposited to a thickness between about 200 and 5,000 Angstrom.

35. The method of claim 32, said STI dielectric comprising HDP oxide.

36. The method of claim 32, said impurity ion implantation blocking mask comprising photoresist.

37. The method of claim 32, said creating an impurity ion implantation blocking mask over the surface of said layer of STI dielectric using a second exposure mask comprising methods of photolithographic exposure and development of an exposed semiconductor material.

38. The method of claim 37, said semiconductor material comprising photoresist.

39. The method of claim 32, said impurity ion implantation into the exposed surface of said layer of STI dielectric being provided under an angle of about ninety degrees with the surface of said deposited layer of STI dielectric.

40. The method of claim 32, said etching said layer of STI dielectric comprising an oxide etchback.

41. The method of claim 32, removing said layer of STI dielectric from the surface of said patterned and etched layer of etch stop material comprising a HF dip.

42. The method of claim 41, further applying a reduction in the timing of the HF dip.

43. The method of claim 32, with an additional step of planarization applied to the surface of said patterned and etched layer of etch stop material and the surface of said layer of STI dielectric.

44. The method of claim 43, said step of planarization comprising methods of Chemical Mechanical Polishing (CMP).

* * * * *